United States Patent [19]
Takemoto et al.

[11] 3,841,928
[45] Oct. 15, 1974

[54] PRODUCTION OF SEMICONDUCTOR PHOTOELECTRIC CONVERSION TARGET

[76] Inventors: Iwao Takemoto, 3-1 Higashikoigakubo, Kokubunji-shi, Tokyo-to; Ichiro Miwa, 1699, Tamagawa-cho, Setagaya-ku, Tokyo-to; Takashi Tokuyama, 3-3-102-303, Hibarigaoka,, Hoya-shi, Tokyo-to, all of Japan

[22] Filed: Nov. 13, 1972

[21] Appl. No.: 305,675

Related U.S. Application Data

[62] Division of Ser. No. 44,015, June 8, 1970, abandoned.

[30] Foreign Application Priority Data

June 6, 1969 Japan ............................... 44-44010

[52] U.S. Cl.................. 148/190, 148/187, 148/188, 148/189, 148/1.5, 317/235 R, 315/11
[51] Int. Cl. ............................................. H01l 7/44
[58] Field of Search ........... 148/190, 187, 189, 188; 317/235 NA; 315/11, 10

[56] References Cited

UNITED STATES PATENTS

| | | | |
|---|---|---|---|
| 3,378,915 | 4/1968 | Zenner | 148/190 UX |
| 3,391,035 | 7/1968 | Mackintosh | 148/188 X |
| 3,403,284 | 9/1968 | Buck et al. | 317/235 X NA |
| 3,474,285 | 10/1969 | Goetzberger | 315/11 |
| 3,481,781 | 12/1969 | Kern | 148/188 X |
| 3,664,895 | 5/1972 | Schaefer et al. | 148/187 |
| 3,676,727 | 7/1972 | Dalton et al. | 148/187 X |
| 3,698,078 | 10/1972 | Redington | 148/187 X |

*Primary Examiner*—G. Ozaki
*Attorney, Agent, or Firm*—Craig & Antonelli

[57] ABSTRACT

In the process for making semiconductor photoelectric conversion targets used in a vidicon comprising an N-type semiconductor wafer having an array of P-type regions in a surface thereof, and an insulating layer provided to cover such surface portions of the wafer other than that of the P-type regions, an N-type impurity is diffused into the surface thereof so as to form a thin highly doped N-type layer in the surface portion of the wafer, either directly before forming the insulating layer or by using another insulating layer doped with an N-type impurity during the formation of the P-type regions.

10 Claims, 9 Drawing Figures

PRODUCTION OF SEMICONDUCTOR PHOTOELECTRIC CONVERSION TARGET

CROSS REFERENCE TO RELATED APPLICATION

This is a Divisional application of prior U.S. Pat. application, Ser. No. 44,015, filed June 8, 1970, now abandoned.

BACKGROUND OF THE INVENTION

This invention relates to improvements in semiconductor targets.

It is known that targets for vidicon tubes are fabricated by forming a large number of PN junction elements, such as diodes and transistors, in a mosaic pattern over a wafer of semiconductor material, such as silicon, germanium, GaAs or other III-V compound. One such example is disclosed in U.S. Pat. No. 3,403,284. Targets of the type described are simple in construction and are capable of being miniaturized while maintaining high sensitivity. Moreover, they are free of so-called "raster burn", a defect that is believed inherent in conventional vidicons in use. This last-mentioned advantageous feature renders the vidicon of the character under consideration amenable to applications particularly where electronic control of electro-zooming is required. For example, in the field of TV telephony, they can exhibit much better performance than existing vidicons of other types.

The conventional semiconductor target is formed by providing P-type regions on one surface of an N-type silicon wafer, which surface is to be scanned by the electron beam. The junctions formed by the regions and the wafer form diodes which are reversely biased so that they function as photo diodes. Usually, a film of insulating material, for example, $SiO_2$, is formed over the area of the target to be scanned, leaving only the P-type regions exposed so as to prevent scanning of the areas of the N-type wafer between the P-type regions.

However, it has been found with the prior art construction that the scanning of the electron beam over the $SiO_2$ film induces positive charging of the surface of the N-type silicon substrate, producing an undesirable inversion layer under the film. In extreme cases, this problem can result in the target becoming inoperative, and in lesser cases, severe instability in the picture is assured.

SUMMARY OF THE INVENTION

Now, therefore, it is an object of the present invention to provide semiconductor targets for television camera tubes, particularly the vidicon tubes, which give pictures of good quality, and a method for manufacturing the same.

Another object of the present invention is to provide semiconductor targets of a novel construction which produces little after-image, permits only a low degree of saturation of the PN junctions, and has no possibility of forming any electroconductive inversion layer and large depletion layer on the target surface in response to an electric voltage applied, and a method for manufacturing the same.

The technical subject matter of this invention resides in semiconductor targets consisting of a semiconductor substrate of N-type conductivity having a high volume resistivity, say in the range of 5 to 15Ωcm. a large number of regions of P-type conductivity formed in a mosaic pattern over one major surface of the substrate, and a film of an insulating material, such as $SiO_2$, $Si_3N_4$, $Al_2O_3$, formed on the part of the semiconductor substrate surface other than the P-type regions, characterized in that a high impurity density layer of N-type conductivity is formed uniformly over the semiconductor substrate surface immediately under the insulating material.

According to the present invention, only the substrate surface layer immediately under the insulating film has a high impurity density and, therefore, the depletion layers of the individual PN junctions will not be widened in the region immediately under the insulating film, to say nothing of rendering those parts conductive positively. In addition, the volume resistivity of the substrate may be high irrespective of the tendency to become P-type and, therefore, the diffusion length of the minority carriers produced upon the receipt of light from the scene being televised is increased and the visible light sensitivity is improved. The junction capacitances of the PN junctions increase negligibly, and the problem of image lag is solved. The depletion layer is reduced to the component which follows the reversely biased voltage that is applied on the PN junctions, and no unusual increase of the dark current takes place.

Usually, the voltage for a semiconductor target is chosen from the range of 5 to 20 volts in consideration of factors such as the capacitance, dark current, and after-image. The positive charge density that is induced on the semiconductor substrate surface immediately under the $SiO_2$ film is between about $2 \times 10^{11}$ and $1 \times 10^{12}$ atoms/cm$^3$. In order that the positive charge thus induced be compensated for, the total impurity density of the semiconductor surface immediately under the insulating film must be not less than $10^{12}$ atoms/cm$^3$. However, an impurity density of over $10^{18}$ atoms/cm$^3$ would bring an insufficient breakdown voltage for the PN junctions, and an impurity density of less than $10^{16}$ atoms/cm$^3$ would unfavorably affect the advantage of this invention. For these reasons it is desirable to choose a density of the N-type impurity diffused layer for the compensation of the induced charge from the range of $1 \times 10^{16}$ to $1 \times 10^{18}$ atoms/cm$^3$. Also, in view of its relation with the capacitances formed in the PN junctions, the depth of the surface impurity density layer is desired to be kept under the depth of the PN junction.

Thus the density and depth of the high impurity density layer can be freely chosen from the ranges above given.

These and other objects and features of this invention will be better understood from the following detailed description taken in conjunction with the accompanying drawings showing embodiments thereof.

DESCRIPTION OF ILLUSTRATIVE EMBODIMENTS

Figure 1:
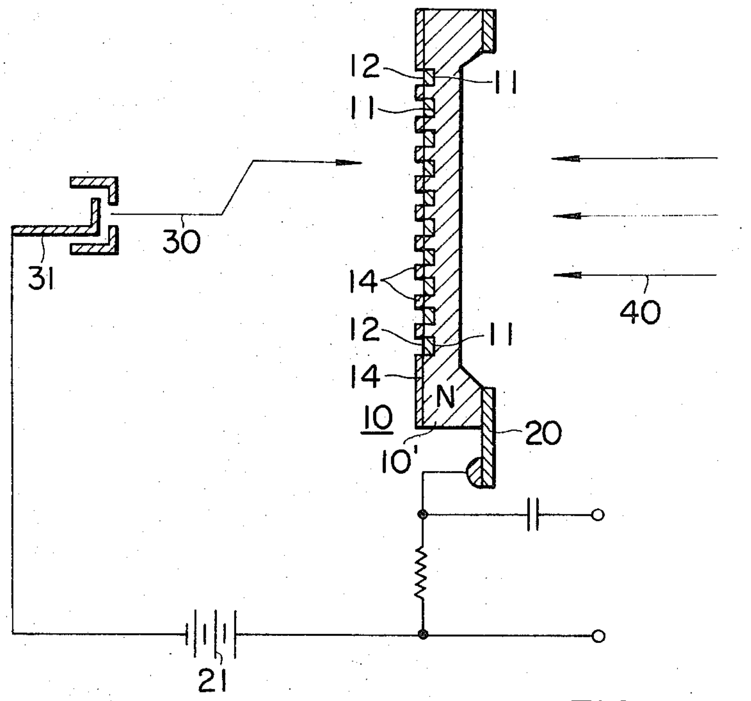
FIG. 1 is a schematic view explanatory of the principles of a vidicon tube which employs a semiconductor target of known type.
Figure 2:
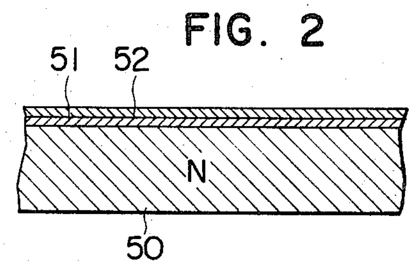
FIGS. 2 to 5 are diagrammatic views illustrating the sequence of fabrication of a semiconductor target embodying this invention.

In the accompanying drawings, FIG. 1 is a schematic view of the construction of a typical vidicon tube using a semiconductor target of the known type described, the essential parts being shown on an enlarged scale for the convenience of explanation. A semiconductor target is generally indicated at 10. Numeral 20 indicates a signal electrode, 30 indicates an electron beam, and 40 indicates light from the scene being televised. As shown, the semiconductor target 10 has a multiplicity of PN junction elements 11 on the area where the electron beam is scanned, the elements being constructed to be diodes formed, for example, by providing P-type regions 12 on the surface of an N-type silicon wafer 10'. In this case the individual PN junctions must be reversely biased in order that the diodes function as photo diodes. This is done, for example, by connecting a power source 21 between the signal electrode 20 provided in contact with the common N-type region 10' for the diodes and a cathode 31 that emits the electron beam 30, in such a direction that the signal electrode 20 is positive and the cathode is negative. As light from the scene falls upon the common N-type region 10' of the photo diodes, pairs of positive holes and electrons proportionate in strength to the light that falls upon it are produced in that region. Of the pairs, the positive holes as minority carriers are diffused in the N-type substrate until they reach the PN junctions 11 and thence, by the action of the space charge regions of the PN junctions, they gain entrance into the P-type regions 12. This causes the electric charges built up in the PN junction capacitances to be discharged in varying degrees depending upon the strength of the light.

In a television camera tube of the type being considered which utilizes the phenomenon above described, the junction capacitances of the individual diodes discharged according to the strength of light are scanned by an electron beam so that the P-type regions can collect electrons and take on electric charges and that the current which flows through the signal electrode at that time can be taken out as a video signal. At this juncture, because a current not related to the strength of light flows as the video signal upon the incidence of the electron beam 30 on the N-type regions of the diodes, it is necessary that the electron beam 30 be so directed as to selectively scan only the P-type regions 12 of the semiconductor target.

For the reason above stated, usually a film 14 of an insulating material is formed over the area of the semiconductor target to be scanned, lest the surfaces other than the P-type regions 12, i.e., the N-type region 10' and the exposed surface of the PN junctions, should be scanned with the electron beam. As a rule, the insulating film 14 is formed of $SiO_2$ for the dual purpose of stabilizing the electric characteristics of the PN junctions and conferring common features thereon.

In a semiconductor target of the construction known in the art, the voltage that is applied on the target at the time of scanning with the electron beam will induce positive charging of the surface of the N-type silicon substrate immediately under the $SiO_2$ film thus tending to convert the N-type surface into a P-type one to disadvantage, If this tendency is strong enough, the Si substrate surface immediately below the $SiO_2$ film will become positively conductive and produce a P-type inversion layer, through which the P-type regions on the substrate surface will be electrically short-circuited. As a result, the picture will be so disturbed that the target will no longer work as such. Conversely, if the tendency is less noticeable, the depletion layer formed in the PN junction layer will spread immediately below the $SiO_2$ layer with the rise of the target voltage, thus allowing a leakage current of PN junctions of an unusual intensity (which is called a dark current when flowing through a semiconductor target) which is composed principally of the surface generation recombination current, and this again produces instability in the picture.

The tendency for induction of positive holes on the substrate surface (or the phenomenon of converting the negative conductivity into a positive one) Varies with the volume resistivity of the substrate. The higher the volume resistivity, the larger depletion layer the substrate tends to have and hence the more easily it becomes P-type. If the resistivity is low, or the substrate is highly doped, the depletion layer will scarcely grow with little chance of rendering the substrate surface positive. However, if the volume resistivity of a semiconductor target is below a certain level (or if the impurity density is above a certain level), the diffusion length of the minority carriers produced by the light falling upon the target will be shortened, thus adversely affecting the target efficiency and increasing the junction capacitances of the PN junctions, with a consequent increase in the after-image on the target. It is thus not advisable to use a semiconductor substrate of low resistivity. Empirically, the semiconductor targets usually chosen have volume resistivities of the substrates in the range of 5 to 15Ωcm. This is because a substrate volume resistivity of less than 5Ωcm would increase the junction capacitance of each PN junction and hence increase the after-image. Conversely, a resistivity of over 15Ωcm would decrease the capacitance to such a degree that the PN junction would promptly be saturated by the photo current.

However, the targets whose substrate volume resistivities range from 5 to 15Ωcm are such that, for example, a target voltage of about 5 volts applied on an N-type silicon substrate having a relatively high resistivity of several ohm-centimeters would broaden the depletion layer immediately below the $SiO_2$ film, and a voltage of about 10 volts would make the substrate surface immediately below the $SiO_2$ film positively conductive. It is also known that a voltage of 7 to 8 volts would be enough to change the conductivity of a substrate having a volume resistivity of between ten and twenty ohm-centimeters from N-type to P-type, thereby deteriorating the characteristics of the particular target.

In FIGS. 2 through 5 there is illustrated the sequence of steps for the manufacture of an embodiment of the invention, a silicon target, which avoids the disadvantages inherent in the known targets.

Figure 3:
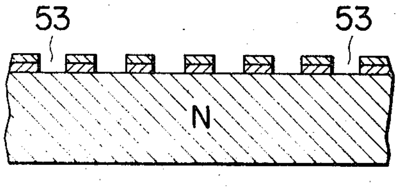
Figure 4:
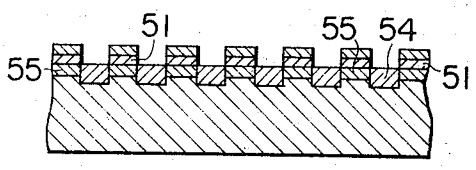

The silicon substrate 50 of N-type conductivity, 150$\mu$ in thickness and 20 mm in diameter and having a volume resistivity of 5Ωcm (impurity concentration $10^{15}$ atoms/cc), is etched on the surface with etchants consisting of an aqueous solution of HF and $HNO_3$, cleaned after the etching, and then is coated on one main surface thereof with a 0.05$\mu$-thick, phosphoruscontaining $SiO_2$ layer 51 and a 0.8$\mu$-thick $SiO_2$ layer 52. (FIG. 2) The phosphorus-containing $SiO_2$ layer 51 may be formed by heat treating the silicon substrate in a mixed atmosphere of $O_2$, $PH_3$ and silane at about 400° to 500° C. The $SiO_2$ layer 52 may be formed by thermal treating in the substrate in an atmosphere of silane and oxygen. Following the forming of the protective films, the resulting double layer is photo-etched as desired at regular intervals to provide openings 53 (e.g., 15 × 15$\mu$ square openings at intervals of 25$\mu$), thereby partly exposing the silicon substrate surface. (FIG. 3).

Next, the silicon substrate is placed in a diffusion furnace (not shown), and boron is allowed to diffuse into the silicon substrate through the openings of the double layer. By the diffusion treatment at about 1100° C. for one hour, a P-type layer 54 is formed in the openings 53 to a depth of 1.5$\mu$ into the substrate. In the meantime the heat treatment at 1100° C. for one hour also causes diffusion of the phosphorus of the phosphorus-containing $SiO_2$ layer 51 into the silicon substrate, thus forming a high impurity density layer 55 of N-type conductivity. (FIG. 4) The impurity density of this high impurity density layer is a function of the phophorus concentration in the phosphorus-containing $SiO_2$ layer, and the temperature and time for the heat treatment. The impurity density of the surface layer which is sufficient for avoiding the widening of the depletion layer and the phenomenon of change in the electroconductivity from N-type to P-type is more than $10^{16}$ atoms/cm$^3$, preferably of the order of $10^{17}$ atoms/cm$^3$. Even if the voltage for the semiconductor target is comparatively high (e.g., about 20 volts), the layer having a surface impurity density of about $10^{17}$ atoms/cm$^3$ is required only to have a thickness of about 0.5$\mu$.

Then, the other main surface of the silicon substrate is etched out, leaving the edges unetched. When this silicon substrate serves as a semiconductor target, light falls upon the recess or hollow 58 thus formed. Accordingly, in response to the light, minority carriers are produced on the hollow surface, and they pass by diffusion to the PN junctions, where they are attracted by the electric fields on the depletion layers into the P-type regions so as to discharge the negative charges in the regions. If the semiconductor substrate is too thick, the minority carriers produced in the substrate will not reach the depletion layers of the PN junctions. If too thin, the substrate will be easily breakable and will be difficult to fabricate. In view of these, it is believed that a semiconductor target having a thickness $l$ which is about one-half of the diffusion length of the minority carriers (i.e., about 40 to 50$\mu$) gives a satisfactory result.

The edges of the substrate are left unetched to retain the original thickness for strength and also for the convenience of attaching an electrode to the substrate.

Figure 5:
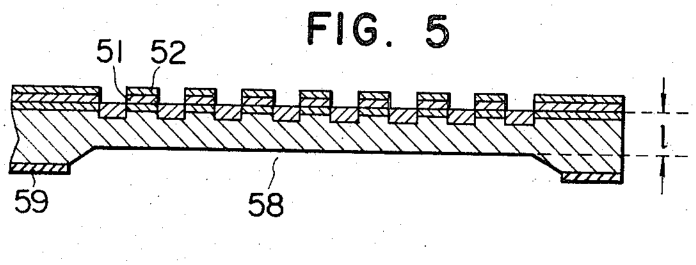
Figure 6:
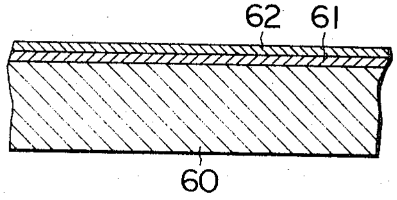
FIGS. 6 to 9 are diagrammatic views illustrating the sequence of fabrication of another embodiment of semiconductor target of the invention.
Figure 7:
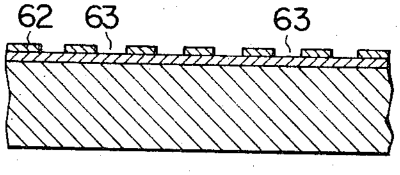
Figure 8:
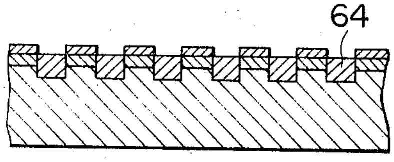

On the edges of the rear side of the silicon target, an aluminum film 59 is formed by plating to serve as an electrode. (FIG. 5)

While phosphorus is diffused for the purpose of compensation for the positive charge in this embodiment, it is possible to diffuse antimony instead. In the latter case, the antimony-containing $SiO_2$ layer is formed in the following manner. By a heat treatment of the semiconductor substrate in a mixed atmosphere of $SbH_3$ vapor and silane vapor (including the carrier gas) at a temperature between 400° and 500° C., an Sb-containing $SiO_2$ layer is formed on the substrate surface.

Another embodiment of this invention will be described hereunder with reference to FIGS. 6 through 9.

Figure 9:
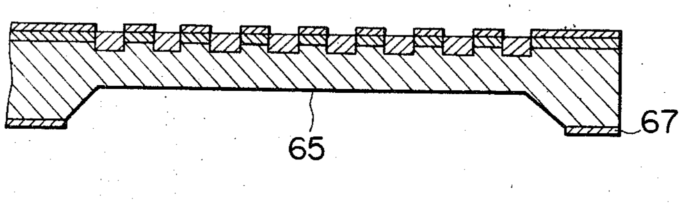

A silicon substrate of N-type conductivity having a volume resistivity of 5Ωcm is generally designated at 60. In the surface layer of the substrate is provided a high impurity density layer 61 formed by diffusion of antimony through the substrate (the surface impurity density being about $10^{16}$ to $10^{18}$ atoms/cm$^3$). This high impurity density layer is covered by a $SiO_2$ film 62 formed by thermal treating the substrate in an atmosphere of silane and oxygen. (FIG. 6) The $SiO_2$ film is photo-etched to form openings 63 of a desired contour. (FIG. 7) Through these openings are formed P-type regions 64 by thermal diffusion of an impurity material of P-type conductivity, such as B (boron). (FIG. 8) Although the Sb of the substrate surface is also rediffused into the substrate, the Sb diffuses at a rate slower than that of B and, consequently, B diffuses deeper into the substrate (that is, by "jump-over" diffusion). The P-type regions having been formed as desired, the rear side of the substrate is etched out with etchants until the thickness of the substrate is reduced to about equal to the diffusion length of the minority carriers so as to form a recess 65 onto which light is transmitted, and then an electrode 67 is formed as by aluminum plating over the edges of the rear side of the substrate. A semiconductor target for the vidicon tube is thus obtained. (FIG. 9)

In this embodiment the $SiO_2$ film used as a mask for the diffusion of the P-type impurity is left as it is on the substrate surface to provide a film for passivation of the PN junctions.

In the practice of this invention, the methods of forming the P- and N-type regions and insulating films are not limited to those referred to in connection with the embodiments, but other known methods may be employed as well. For example, when forming the P-type regions or N-type regions, the ion implantation technique may be resorted to as well as the usual method of impurity diffusion. The insulating film of $SiO_2$ may be supplanted by a film of $Al_2O_3$, $Si_3N_4$, flint glass, borosilicate glass, phosphosilicate glass, alumino-silicate glass or their mixture, or a composite film of double layer, triple layer or the like. The advantageous features of this invention are as outstandingly manifest in a semiconductor target of a construction in which regions of an electrically conductive metallic layer extended over the insulating film are jointed to the P-type regions.

While the present invention has so far been described in connection with embodiments thereof which are silicon targets, it is to be appreciated that this invention is not restricted thereto but semiconductor targets using substrates of other semiconductors, e.g., germanium, GaAs, InSb, InP, and GaP, may be fabricated as well, without departing from the scope and spirit of this invention.

Further, it has been found that the semiconductor targets according to this invention may be employed with remarkable advantage as targets for electron-beam and X-ray imaging in structural analyses.

What we claim is:

1. A method of making a semiconductor photoelectric conversion target comprising the steps of:

a. preparing a semiconductor substrate of a first conductivity type, which has one major surface;

b. forming a first insulating layer including a first impurity of the first conductivity type of predetermined concentration on the major surface of said substrate;
c. depositing a second insulating layer over said first insulating layer;
d. making apertures in array fashion in said two insulating layers to expose desired surface portions of the semiconductor substrate through said apertures;
e. diffusing a second impurity of a second conductivity type opposite to said first conductivity type into the substrate from said exposed surface thereof through the apertures, whereby an array of second conductivity regions is formed by said diffusion of the second impurity into said major surface thereof and a high impurity concentration layer of said first conductivity type is simultaneously formed by diffusion of said first impurity included in said insulating layer into the surface of the substrate beneath said insulating layers during the diffusion of the second impurity; and
f. providing a signal electrode to said substrate so as to apply a desired potential to said substrate.

2. The method defined in claim 1, wherein said first impurity is phosphorus.

3. The method defined in claim 2, wherein said step of forming a first insulating layer comprises treating the substrate in an atmosphere of $O_2$, $PH_3$ and silane at about 400° to 500° C.

4. The method defined in claim 1, wherein said first impurity is antimony.

5. The method defined in claim 4, wherein said step of forming a first insulating layer comprises treating the substrate in an atmosphere of $O_2$, $SbH_3$ and silane at about 400° to 500° C.

6. The method defined in claim 1, wherein said semiconductor substrate is silicon.

7. The method defined in claim 1, wherein said semiconductor substrate has a volume resistivity of from about 5 to 15Ωcm.

8. A method of making a semiconductor photoelectric conversion target comprising the steps of:
a. preparing a semiconductor substrate of a first conductivity type, which has a major surface;
b. diffusing a first impurity of the first conductivty type into said substrate from said major surface thereof so as to form a high impurity concentration layer therein;
c. forming an insulating layer over said major surface of the substrate;
d. making an array of apertures in said insulating layer to expose desired surface portions of the substrate through said apertures;
e. diffusing a second impurity of a second conductivity type opposite to said first conductivity type into said substrate at the surface portions thereof exposed through said apertures so as to form an array of semiconductor regions of the second conductivity type; and
f. forming a signal electrode onto the substrate to apply desired potential to said substrate.

9. The method defined in claim 8, wherein said semiconductor substrate is silicon.

10. The method defined in claim 8, wherein said semiconductor substrate has a volume resistivity of from about 5 to 15Ωcm.

* * * * *